United States Patent
Louis et al.

(10) Patent No.: US 8,072,263 B2
(45) Date of Patent: Dec. 6, 2011

(54) POWER CONTROL DEVICE FOR A SIGNAL WITH OPTIMIZED INPUT DYNAMICS

(75) Inventors: Bruno Louis, St Maur (FR); Vincent Petit, Bazainville (FR); Rémi Corbiere, Elancourt (FR)

(73) Assignee: Thales (FR)

( * ) Notice: Subject to any disclaimer, the term of this patent is extended or adjusted under 35 U.S.C. 154(b) by 0 days.

(21) Appl. No.: 12/640,332

(22) Filed: Dec. 17, 2009

(65) Prior Publication Data

US 2010/0156719 A1    Jun. 24, 2010

(30) Foreign Application Priority Data

Dec. 19, 2008    (FR) ..................... 08 07236

(51) Int. Cl.
*H03F 3/68*    (2006.01)
*H03G 3/20*    (2006.01)

(52) U.S. Cl. ................. 330/124 R; 330/136

(58) Field of Classification Search .......... 330/124 R, 330/134, 136
See application file for complete search history.

(56) References Cited

U.S. PATENT DOCUMENTS

| | | | |
|---|---|---|---|
| 7,250,814 B2 * | 7/2007 | Bardsley et al. ............... 330/51 |
| 2007/0296501 A1 | 12/2007 | Matsui | |
| 2008/0186100 A1 | 8/2008 | Okanobu | |

FOREIGN PATENT DOCUMENTS

| | | |
|---|---|---|
| EP | 1 524 769 A2 | 4/2005 |
| GB | 2 432 735 A | 5/2007 |

* cited by examiner

*Primary Examiner* — Steven J Mottola
(74) *Attorney, Agent, or Firm* — Baker & Hostetler, LLP

(57) ABSTRACT

A signal power control device comprises two amplification channels. A first amplification channel comprises a first transconductance amplifier and a second amplification channel comprises an attenuator mounted in series with a second transconductance amplifier. Gain adjustment means allow the respective gains of the first and the second amplifier to be controlled independently, according to laws, ensuring optimum output dynamics across the entire gain range of the power control device.

7 Claims, 4 Drawing Sheets

POWER CONTROL DEVICE FOR A SIGNAL WITH OPTIMIZED INPUT DYNAMICS

CROSS-REFERENCE TO RELATED APPLICATIONS

This application claims priority of foreign French patent application no. FR 0807236, filed Dec. 19, 2008, the disclosure of which is hereby incorporated by reference in its entirety.

BACKGROUND OF THE INVENTION

1. Field of the Invention

The present invention relates to a power control device for a signal with optimized input dynamics. The device according to the invention enables automatic gain control of the power control device. It is applied, for example, to the signal reception channel in a satellite geopositioning device.

2. Discussion on the Background

An automatic gain control device, notably used in a radio transmission or reception channel, enables adjustment of the amplification gain of the input signal in such a way as to obtain an acceptable signal level at the channel output, independently of the power of the input signal. This enables presentation to the circuit located at the end of the transmission or reception channel of a signal whose power is optimum for guaranteeing the expected performance of the transmission/reception channel.

Devices such as, for example, channels for the reception of signals originating from satellites, which are fitted to geopositioning devices such as GPS ("Global Positioning System") receivers, operate under high input dynamics, with extremely low-power signals. It must be noted here that signals with high input dynamics are signals in which the difference between the highest levels and the lowest levels is great. In devices of this type, it is necessary to minimize the interference caused by any non-linearity of the system in order to be able to ensure acceptable sensitivity. The system therefore requires a function whose performance is constant across the entire input dynamic range. Moreover, for applications with very low consumption, it is necessary to ensure that the automatic gain control minimizes consumption.

Solutions currently exist which consist in utilizing functions which reduce the output dynamics at the same time as the gain, as these functions present constant input dynamics. Solutions of this type assume that, the higher the power of the input signal, the more the automatic gain control function reduces, thereby lowering the output compression, i.e. reducing the ratio between the highest and lowest levels. The power of the output signal then becomes inconsistent with the power of the signal to be processed. To overcome this problem, some solutions consist in overdimensioning the compression of the input stage, which adversely affects consumption.

Other solutions exist which use counter-reaction systems on the transmitters, which adversely affects the noise factor.

All of the aforementioned solutions are incompatible with the low-consumption constraint, and are rarely compatible with a low-voltage power supply.

SUMMARY OF THE INVENTION

The present invention overcomes the aforementioned problems by proposing a solution which provides a guarantee of the required performance for low-power signals, while minimizing consumption in the case of higher-power signals. The invention guarantees the required compression level in relation to the processed signal, for example by maintaining a level of 10 dB above the nominal processed signal across the entire dynamic range of the input signal.

The invention consists in switching in a progressive manner two parallel amplification channels whose characteristics are distinct and whose gain is current-controlled in order to guarantee both the expected gain dynamics and a compression level which is consistent with the processed signal. For this purpose, a current law is implemented in order to distribute the gains of the two channels in an optimum manner. Advantageously, a first amplification channel comprises a first amplifier, and a second amplification channel comprises a passive attenuator in series with a second amplifier. The output signal is obtained by adding together the output signals of the two parallel structures. A further advantage of this invention is to enable integration of the power control device into integrated circuits implemented according to the known techniques of Monolithic Microwave Integrated Circuits (MMICs), or Application-Specific Integrated Circuits (ASICs).

For this purpose, the subject of the invention is a signal power control device comprising a first amplification channel comprising a first amplifier, a second amplification channel comprising a fixed-gain attenuator in series with a second amplifier, and an adder, the first amplification channel and the second amplification channel comprising gain adjustment means, an input signal being applied to the first amplification channel, and in parallel with the second amplification channel, the outputs of the first and second amplification channels being connected to the inputs of the adder, the gain adjustment means being suitable for distributing the respective gains of the first amplification channel and the second amplification channel depending on the power of the input signal according to a distribution law according to which the gain of the second amplification channel is minimal for the lowest input powers, and the gain of the first amplifier channel is minimal for the highest input powers, the gains of the first amplification channel and the second amplification channel being adjusted in a progressive and continuous manner for the intermediate input powers.

In one embodiment of the invention, the signal power control device described above can be characterized in that the first amplifier and the second amplifier are transconductance amplifiers, the gain adjustment means comprising means for controlling a first polarization current $I_1$ of the first amplifier, and a second polarization current $I_2$ of the second amplifier depending on a control current $I_c$.

In one embodiment of the invention, the power control device can be characterized in that the gain of the control device expressed in decibels is proportional to the logarithm of the control current $I_c$ in the normal operating range.

In one embodiment of the invention, the signal power control device described above can be characterized in that the means for controlling the first polarization current $I_1$ of the first amplifier and the second current $I_2$ are suitable for shaping the two currents, each according to a law dependent on a control current $I_c$.

A further subject of the invention is a satellite geopositioning device comprising a signal reception and amplification channel, comprising a power control device as described above.

BRIEF DESCRIPTION OF THE DRAWINGS

Other characteristics and advantages of the invention are explained in the description, given by way of example, and relating to the appended drawings, in which.

DESCRIPTION OF THE PREFERRED EMBODIMENTS

Figure 1:
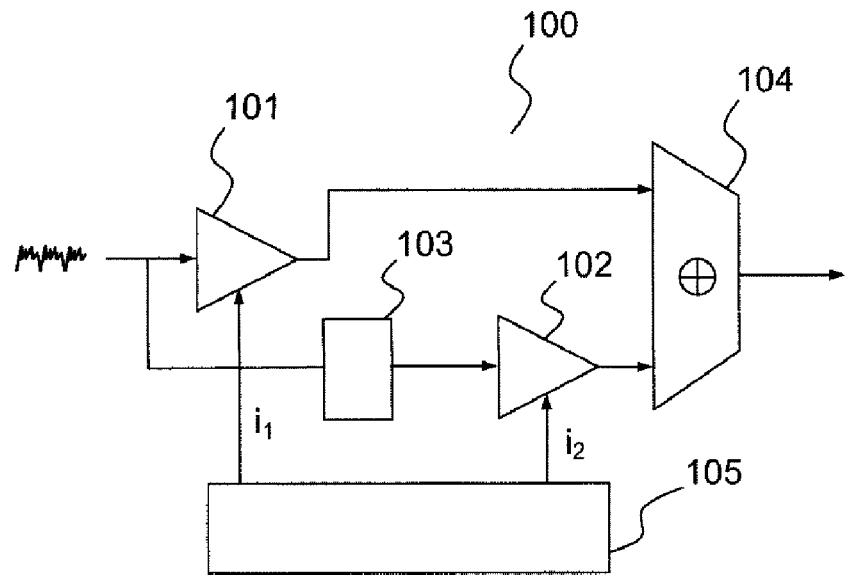
FIG. 1 shows the synopsis of an example of a power control device according to the invention.

FIG. 1 shows, in synoptic form, an example of a power control device 100 according to the invention. The device 100 comprises a first amplifier 101, a second amplifier 102, an attenuator 103, an adder 104 and a device 105 to control the polarization currents of the amplifiers 101 and 102. The polarization currents of the amplifiers 101 and 102 are hereafter respectively denoted as $I_1$ and $I_2$.

An input signal is sent on a first amplification channel comprising exclusively the first amplifier 101, and in parallel on a second amplification channel, comprising the attenuator 103, which is mounted in series with the amplifier 102. The output signals of these two amplification channels are summated by the adder 104, from which the output signal of the power control device originates.

The amplifiers 101 and 102 are transconductance amplifiers whose gain can be controlled by their polarization current. The two amplifiers 101 and 102 may, for example, present identical structural characteristics. The current control device 105 is powered by a current source not shown in the Figure, but described below with reference to FIG. 2. If the power control device according to the invention is used in a satellite geopositioning receiver, the signal applied to the input of the power device 100 may, for example, originate from an integrated antenna or an active external antenna, i.e. producing an amplified signal. In both cases, the useful signal presents low dynamics in relation to the noise, but the amplitude of the input signal may nevertheless vary within a wide range of values, up to a value in the order of several hundred millivolts peak-to-peak. The invention proposes that a single power control channel, which can be easily integrated within a printed circuit, can process both high-amplitude signals and low-amplitude signals in an optimum manner, i.e. it enables the presentation, to a circuit located at the end of the transmission or reception channel, of a signal guaranteeing the expected system performance. In other words, the power control device must be capable of supplying ideally constant output dynamics, over the widest possible gain range, typically in the order of 30 dB.

The amplifiers 101 and 102 each comprise, for example, a transistor. The power control device 100 thus comprises a stack of two transistors, in contrast to automatic gain control devices known in the state of the art, which normally comprise three amplifiers, typically transistors, in cascode assemblies. The power control device 100 according to one of the embodiments of the invention may therefore merely require a low-voltage power supply, typically two third of the power supply voltage required by a known device based on a cascode assembly.

For this purpose, the current control device 105, described in detail below with reference to FIG. 2, enables the adjustment of the respective gains of the two amplifiers 101 and 102 in an independent manner, the total gain of the power control device being the sum of the gains of the two amplifiers 101 and 102 and the attenuator 103. The law imposed on the polarization currents of each of the two amplifiers 101 and 102, as well as the characteristics of the attenuator 103, whose attenuation factor is fixed, are calculated in such a way as to guarantee more or less constant output dynamics over the chosen gain range.

Thus, at maximum gain, i.e. for low-amplitude signals applied to the input, only the first amplifier 101 is polarized by a maximum current the current $I_2$ being zero. This allows an optimum noise factor to be provided.

When the amplitude of the input signal increases, the polarization current $I_1$ of the first amplifier 101 is reduced according to a first law determined and described more precisely with reference to FIG. 3, whereas the polarization current $I_2$ of the second amplifier increases according to a determined second law, thereby enabling an increase in the input dynamics thanks to the presence of the attenuator 103.

At minimum gain, only the second amplifier 102 is polarized, the current $I_2$ is at its maximum value, whereas the current $I_1$ is zero. The value of the attenuation factor of the attenuator 103 allows the input dynamics of the power control device 100 to be increased and the maximum gain of this value to be reduced.

Figure 2:
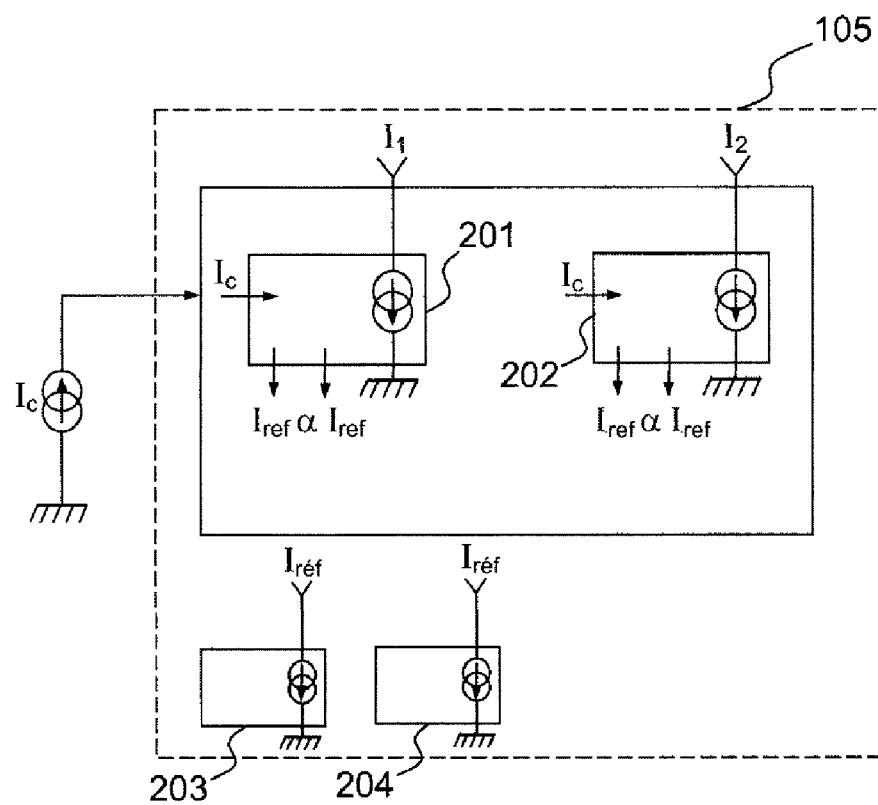
FIG. 2 shows the synopsis of an example of the structure of the current control device according to the invention.

FIG. 2 shows the synopsis of an example of the structure of the current control device 105 according to the invention. The current control device 105 comprises a first block 201 to generate the polarization current of the first amplifier 101, and a second block 202 to generate the polarization current $I_2$ of the second amplifier 102. A third current-generating block 203 produces a first reference current $I_{ref}$. A fourth current-generating block 204 produces a second reference current $\alpha I_{ref}$, where $\alpha$ is a coefficient defining the useful gain dynamics of the power control device; the value of $\alpha$ is determined by the attenuation coefficient of the attenuator 103. A single current source may, for example, be used to generate the two reference currents $I_{ref}$ and $\alpha I_{ref}$. The first block 201 for generating the current and the second block 202 for generating the current $I_2$ are controlled by the command current $I_c$, and also by the command currents $I_{ref}$ and $\alpha I_{ref}$. Each of the currents and $I_2$ complies with a law dependent on the control current $I_c$, and also the reference currents $I_{ref}$ and $\alpha I_{ref}$.

It is known that transconductance varies proportionally to the inverse of the absolute temperature. In order to free itself from the effects of the variation in absolute temperature, the control current $I_c$ follows a law proportional to the absolute temperature, known to the person skilled in the art by the name of PTAT (Proportional To Absolute Temperature). In the same way, the reference currents $I_{ref}$ and $\alpha I_{ref}$ are proportional to the absolute temperature.

Figure 3A:
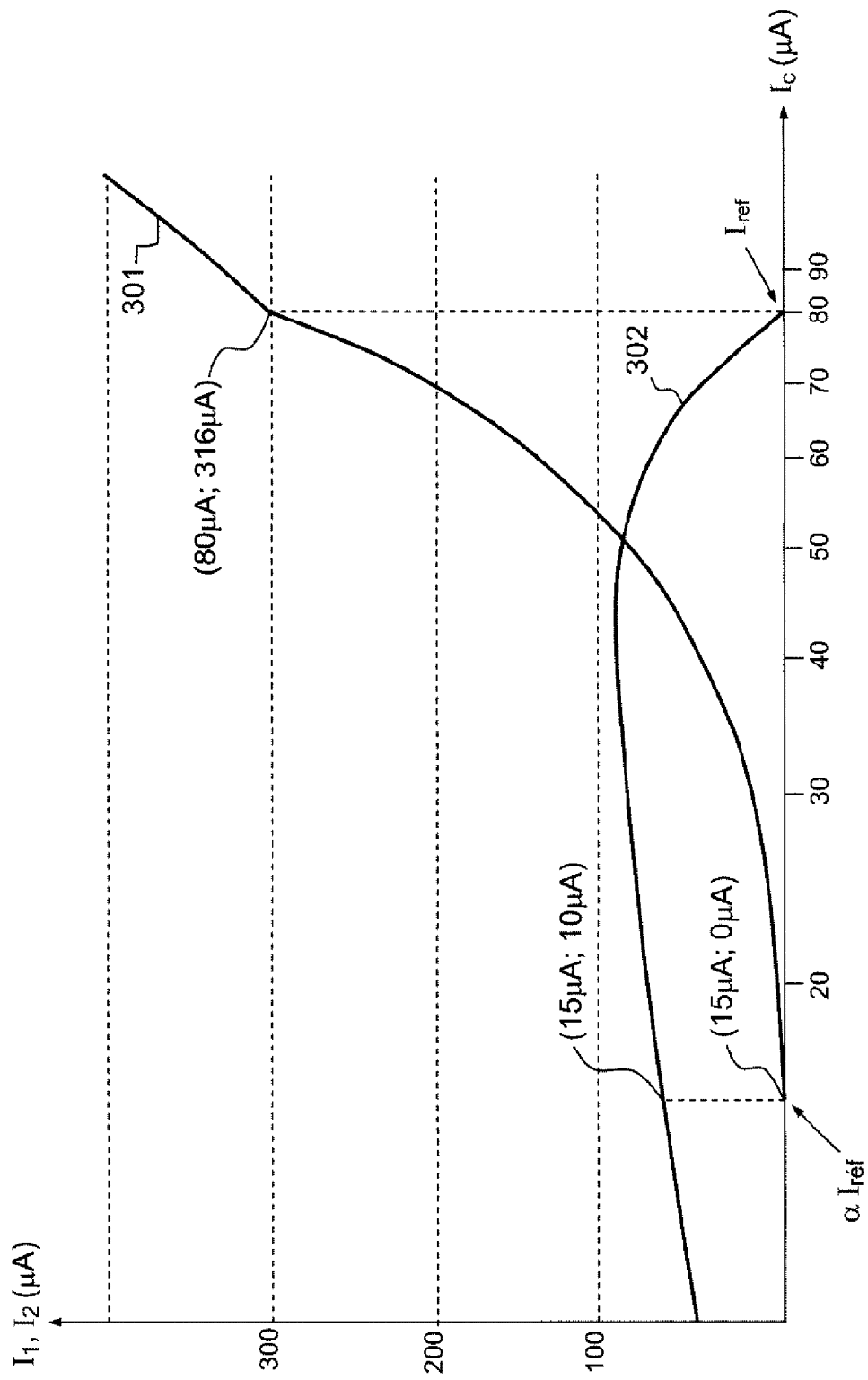
FIG. 3a shows an example of graphs representing the polarization currents of the two amplifiers, depending on a control current.

FIG. 3a shows an example of graphs 301 and 302 respectively representing the polarization currents and $I_2$ of the two amplifiers 101 and 102, depending on the control current $I_c$ represented according to a logarithmic scale.

Figure 3B:
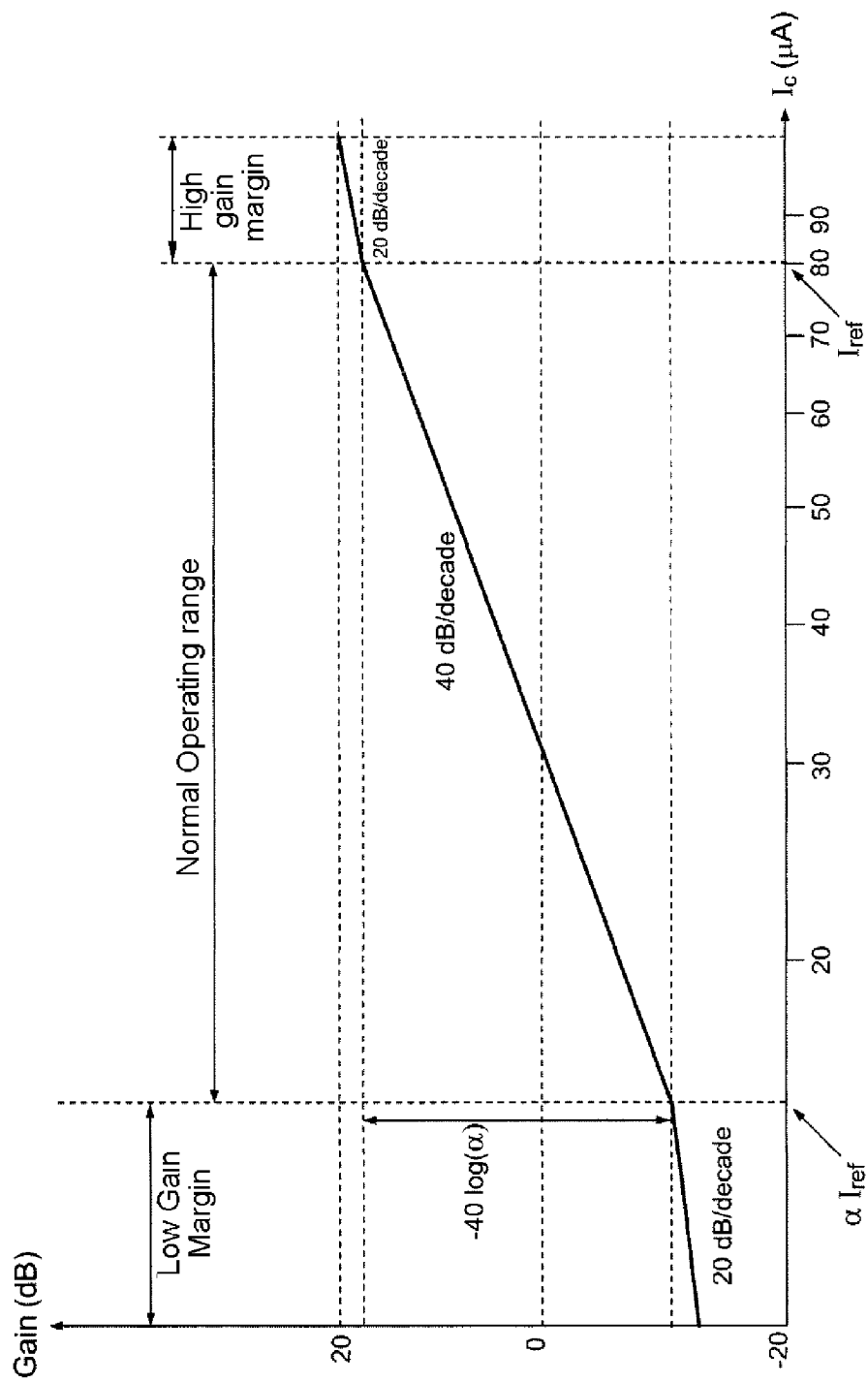
FIG. 3b shows an example of a graph representing the gain of the power control device according to the invention, depending on the control current.

FIG. 3b shows an example of a graph representing the gain of the power control device according to the invention, depending on the control current $I_c$, represented according to a logarithmic scale.

Figure 3C:
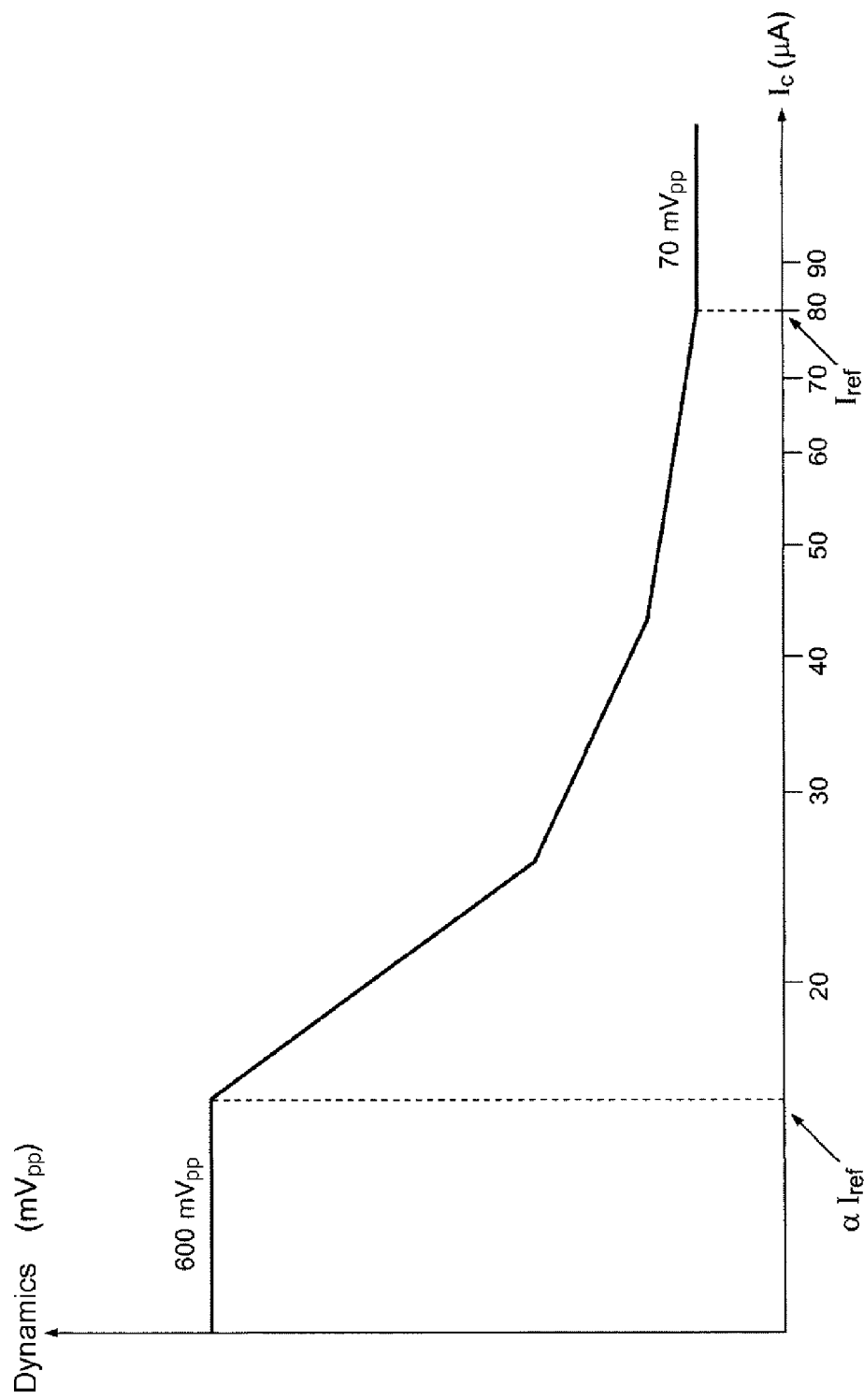
FIG. 3c shows an example of a graph representing the dynamics of the input signal of the power control device according to the invention, depending on the control current.

FIG. 3c shows an example of a graph representing the dynamics of the input signal of the power control device according to the invention, expressed as $mV_{pp}$, depending on the control current $I_c$. A parallel analysis of FIGS. 3a, 3b and 3c enables a better understanding of the invention.

In the example shown in FIG. 3a, the reference current $I_{ref}$ is set to 80 µA and the current $\alpha I_{ref}$ to 15 µA. It must be noted that these two reference currents define the useful gain dynamics. Thus, for the maximum gain of the required gain dynamics of the device 100, i.e. a gain in the order of 18 dB in the example shown in FIG. 3b and input signal dynamics in the order of 70 $mV_{pp}$ in the example shown in FIG. 3c, the current $I_1$ is at a maximum value of 316 µA, whereas the current $I_2$ is zero. If the gain needs to be reduced in the required gain dynamics, with a slope of 40 dB per decade in the example shown in FIG. 3b, and the input signal dynamics need to be increased, the control current $I_c$ reduces; the current $I_t$ begins to reduce progressively, and the current $I_2$ begins to increase. The minimum gain value in the required gain dynamics, in the order of −12 dB in the example shown in FIG. 3b, for input dynamics in the order of 600 $mV_{pp}$ in the example shown in FIG. 3c, corresponds to a control current $I_c$ value equal to the reference current $\alpha\, I_{ref}$.

It is desirable to allow the gain to be able to increase slightly beyond the maximum value of the required gain dynamics, and below the minimum value. Thus, as shown in FIG. 3b, the power control device 100 according to the invention produces a low gain margin, in which the gain may reduce with the current rather than remain fixed at a minimum value, and also a high gain margin, in which the gain can increase with the current. In the example shown in FIG. 3b, the gain may vary depending on the control current $I_c$ by 20 dB per decade. As shown in FIG. 3c, the input dynamics remain stable in the low and high gain margins, the current $I_1$ being zero in the low margin, and the current $I_2$ in the high margin.

One advantage of the invention is that the gain control law is perfectly linear in the normal operating range, i.e. the gain in dB is linear depending on the control current $I_c$ expressed on a logarithmic scale. The normal operating range is, in other words, the optimized operating range in terms of the input dynamics. The linearity offers an advantage for the calculation of the control current which is to be applied, and also for the calculation of the loop and for its stability. More precisely, in the normal operating range, the two amplification blocks formed by the amplifiers 101 and 102 are active, their respective polarization currents $I_1$ and $I_2$ being non-zero; the slope in the example shown in FIG. 3b being 40 dB per decade, thanks to the laws for the applied currents $I_1$ and $I_2$. Outside the normal operating range, at the highest gains, only the head amplification block, i.e. the first amplifier 101, operates, the polarization current $I_1$ being non-zero, and $I_2$ being zero. The slope is then 20 dB per decade. This characteristic similarly offers an advantage compared to automatic gain control devices known in the state of the art and based on a cascode assembly, in which the gain would then be subject to an upper limit. In the case of the present invention, a range therefore exists which constitutes a margin for the dimensioning of the device.

It must be noted that it is the laws imposed on the currents $I_1$ and $I_2$ which provide the device according to the invention with its performance characteristics.

What is claimed is:

1. A signal power control device, comprising:
   a first amplification channel comprising a first amplifier,
   a second amplification channel comprising a fixed-gain attenuator in series with a second amplifier,
   an adder, and
   an analog gain adjustment means applied to the first amplification channel and the second amplification channel, an input signal being applied to the first amplification channel, and in parallel with the second amplification channel, the outputs of the first and second amplification channels being connected to the inputs of the adder, and the gain adjustment means being suitable for distributing the respective gains of the first amplification channel and the second amplification channel depending on the power of the input signal according to a distribution law, according to which the gain of the second amplification channel is minimal for the lowest input powers, and the gain of the first amplifier channel is minimal for the highest input powers, the gains of the first amplification channel and the second amplification channel being adjusted in a progressive and continuous manner for the intermediate input powers.

2. The signal power control device according to claim 1, wherein the first amplifier and the second amplifier are transconductance amplifiers, the gain adjustment means comprising means for controlling a first polarization current $I_1$ of the first amplifier, and a second polarization current $I_2$ of the second amplifier depending on a control current $I_C$.

3. The signal power control device according to claim 2, wherein the gain of the signal power control device expressed in decibels, is proportional to the logarithm of the control current $I_C$ in the normal operating range.

4. The signal power control device according to claim 3, wherein the means for controlling the first polarization current $I_1$ of the first amplifier, and the second current $I_2$ are suitable for shaping the two currents, each according to a law dependent on a control current $I_c$.

5. A satellite geopositioning device, comprising a signal reception and amplification channel, comprising a signal power control device according to claim 1.

6. A method of controlling signal power, comprising:
   applying an input signal to a first amplification channel and to a second amplification channel in parallel with the first amplification channel;
   adjusting respective gains of the first amplification channel and the second amplification channel based on the input signal power according to a distribution law, the gain of the second amplification channel being minimal for the lowest input signal power, the gain of the first amplification channel being minimal for the highest input signal power, and the gains of the first amplification channel and the second amplification channel being adjusted by analog adjustment in a progressive and continuous manner or intermediate input signal powers; and
   adding outputs of the first amplification channel and the second amplification channel.

7. The method according to claim 6, wherein the adjusting includes controlling a first polarization current of a first amplifier in the first amplification channel and controlling a second polarization current of a second amplifier in the second amplification channel based on a control current.

* * * * *

UNITED STATES PATENT AND TRADEMARK OFFICE
CERTIFICATE OF CORRECTION

| | | |
|---|---|---|
| PATENT NO. | : 8,072,263 B2 | Page 1 of 1 |
| APPLICATION NO. | : 12/640332 | |
| DATED | : December 6, 2011 | |
| INVENTOR(S) | : Bruno Louis et al. | |

It is certified that error appears in the above-identified patent and that said Letters Patent is hereby corrected as shown below:

Column 6,
Line 51, after the word "manner", delete the word "or", insert --for--.

Signed and Sealed this
Twentieth Day of March, 2012

David J. Kappos
*Director of the United States Patent and Trademark Office*